United States Patent
Akiyama

(10) Patent No.: US 7,353,493 B2
(45) Date of Patent: Apr. 1, 2008

(54) EXPOSURE MASK, OPTICAL PROXIMITY CORRECTION DEVICE, OPTICAL PROXIMITY CORRECTION METHOD, MANUFACTURING METHOD OF SEMICONDUCTOR DEVICE, AND OPTICAL PROXIMITY CORRECTION PROGRAM

(75) Inventor: Hisashi Akiyama, Tokyo-to (JP)

(73) Assignee: Seiko Epson Corporation (JP)

( * ) Notice: Subject to any disclaimer, the term of this patent is extended or adjusted under 35 U.S.C. 154(b) by 693 days.

(21) Appl. No.: 10/846,837

(22) Filed: May 14, 2004

(65) Prior Publication Data

US 2005/0008947 A1 Jan. 13, 2005

(30) Foreign Application Priority Data

May 15, 2003 (JP) .............................. 2003-136914

(51) Int. Cl.
*G06F 17/50* (2006.01)

(52) U.S. Cl. .......................................... 716/21; 716/19

(58) Field of Classification Search ............ 716/19–21; 430/5, 22, 30
See application file for complete search history.

(56) References Cited

U.S. PATENT DOCUMENTS 6,428,940 B1 * 8/2002 Sandstrom ................... 430/22
7,001,693 B2 * 2/2006 Liebmann et al. ............. 430/5
7,093,229 B2 * 8/2006 Pang et al. ..................... 716/21
2002/0076624 A1 * 6/2002 Buck ............................. 430/5

FOREIGN PATENT DOCUMENTS

| JP | 08-202020 | 8/1996 |
| JP | 2000-181045 | 6/2000 |
| JP | 2000-310851 | 11/2000 |

OTHER PUBLICATIONS

Communication from Japanese Patent Office re: related application.

* cited by examiner

*Primary Examiner*—Jack Chiang
*Assistant Examiner*—Binh Tat
(74) *Attorney, Agent, or Firm*—Harness, Dickey & Pierce, P.L.C.

(57) ABSTRACT

An optical proximity correction is provided that generates a corrected pattern P0 corresponding to a state M0 where the focus is in focus and the exposure dose is optimal, a corrected pattern P1 corresponding to a state M1 where the focus is in focus and the exposure dose is at the lower limit, a corrected pattern P2 corresponding to a state M2 where the focus is in focus and the exposure dose is at the upper limit, a corrected pattern P3 corresponding to a state M3 where the focus deviates to the lower side and the exposure dose is optimal, and a corrected pattern P4 corresponding to a state M4 where the focus deviates to the upper side and the exposure dose is optimal. By combining these corrected patterns P0 through P4, a composed pattern P5 is generated that reflects the scattering of the exposure dose and the deviation of the focus.

10 Claims, 5 Drawing Sheets

EXPOSURE MASK, OPTICAL PROXIMITY
CORRECTION DEVICE, OPTICAL
PROXIMITY CORRECTION METHOD,
MANUFACTURING METHOD OF
SEMICONDUCTOR DEVICE, AND OPTICAL
PROXIMITY CORRECTION PROGRAM

RELATED APPLICATIONS

This application claims priority to Japanese Patent Application No. 2003-136914 filed May 15, 2003 which is hereby expressly incorporated by reference herein in its entirety.

BACKGROUND

1. Field of the Invention

The present invention relates to an exposure mask, an optical proximity correction (OPC) device, an optical proximity correction method, a manufacturing method for a semiconductor, and an optical proximity correction program, and more particularly, it is favorably applied to an optical proximity correction method considering a photo margin.

2. Description of the Related Art

In conventional optical proximity correction methods, for example, as is shown in Japanese Unexamined Patent Application Publication No. 2000-310851, for the sizing process of the graphical data for an electron beam (EB) lithography device providing an OPC part, there is a method for carrying out the sizing process using the sizing values differing in the figures with OPC and the figures without OPC and then combining both figures that have undergone the sizing process, in order to prevent the disappearance of the OPC part.

However, in conventional optical proximity correction methods, a problem is encountered in that the influence of the scattering of an exposure dose and the deviation of a focus has to be corrected by hand as the influence of the scattering of the exposure dose and the deviation of the focus are not considered when making a simulation-based adjustment.

Here, the present invention is intended to provide an exposure mask, an optical proximity correction device, an optical proximity correction method, a manufacturing method for a semiconductor, and an optical proximity correction program which enable the correction of optical proximity effects while considering the photo margin.

SUMMARY

In order to solve the above-mentioned issue, in an exposure mask according to one aspect of the present invention, the pattern of the mask is corrected by simulation-based correction based on both measured data with proper focus and exposure dose and measured data with at least one of focus and exposure dose deviating.

Thereby, while reflecting the scattering of the exposure dose or the deviation of the focus, it becomes possible to carry out optical proximity correction of the mask pattern. Therefore, even in the case where the exposure dose or the focus deviates in the exposure step, the optical proximity effect can be effectively corrected, and it becomes possible to efficiently produce fine patterns.

An optical proximity correction device according to another aspect of the present invention includes a data input means for inputting data of a pattern to be processed, a first corrected pattern generating means for generating a first corrected pattern by correcting the pattern to be processed based on a model adjusted with reference to measured data with proper focus and exposure dose, a second corrected pattern generating means for generating a second corrected pattern by correcting the pattern to be processed based on a model adjusted with reference to measured data with at least one of focus and exposure dose deviating, and a composed pattern generating means for generating a composed pattern by combining the first corrected pattern and the second corrected pattern.

According to this, while reflecting the scattering of the exposure dose and the deviation of the focus, it becomes possible to carry out optical proximity correction of the mask pattern, and even in the case where the exposure dose or the focus deviates in the exposure step, the optical proximity effect can be effectively corrected.

An optical proximity correction device according to another aspect of the present invention includes a data input means for inputting data of a pattern to be processed, a first corrected pattern generating means for adding a hammerhead, a serif and a bias to each line-end region, corner region, and line-and-space region of the pattern to be processed, based on a model adjusted with reference to measured data with proper focus and exposure dose, a second corrected pattern generating means for adding a hammerhead, a serif and a bias to each line-end region, corner region, and line-and-space region of the pattern to be processed, based on a model adjusted with reference to measured data with at least one of focus and exposure dose deviating, and a composed pattern generating means for generating a composed pattern by combining the first corrected pattern and the second corrected pattern.

Thereby, it becomes possible to add a hammerhead, a serif and a bias to each line-end region, corner region, and line-and-space region of the pattern to be processed while reflecting the scattering of the exposure dose and the deviation of the focus, and the optical proximity effect can be effectively corrected even in the case where the exposure dose or the focus deviates in the exposure step.

Further, in the optical proximity correction device according to another aspect of the present invention the measured data with at least one of focus and exposure dose deviating is data on a photo margin borderline.

Thereby, even in the case where a photo process varies within a norm value, it becomes possible to efficiently generate a mask pattern in which the optical proximity effect can be effectively corrected.

Further, in the optical proximity correction device according to another aspect of the present invention the composed pattern generating means further includes a first dimensional deviation calculating means for calculating a dimensional deviation between the pattern to be processed and the first corrected pattern as for at least part of edges, a second dimensional deviation calculating means for calculating a dimensional deviation between the pattern to be processed and the second corrected pattern as for at least part of edges, and a weighted average calculating means for calculating the weighted average of the dimensional deviations each calculated by the first dimensional deviation calculating means and the second dimensional deviation calculating means.

Thereby, while enabling the adjustment of the degree to which the scattering of the exposure dose and the deviation of the focus are reflected, it becomes possible to easily compose a plurality of patterns reflecting the scattering of the exposure dose and the deviation of the focus, and to efficiently generate an optical proximity correction pattern reflecting the scattering of the exposure dose and the deviation of the focus.

Further, in the optical proximity correction device according to another aspect of the present invention a rule-based correcting means for rule-based correcting of a border of a composed pattern that is generated by the composed pattern generating means.

Thereby, by combining a plurality of patterns reflecting the scattering of the exposure dose and the deviation of the focus, even in the case where in the vicinity of the border of the composed pattern small steps have been created, it becomes possible to easily remove these steps and to pass through a design rule check or an optical rule check.

An optical proximity correction method according to another aspect of the present invention includes:

inputting data of a pattern to be processed, adjusting a model for optical proximity correction with reference to measured data with proper focus and exposure dose, generating a first corrected pattern by correcting the pattern to be processed based on the model for optical proximity correction adjusted with reference to the measured data with proper focus and exposure dose, adjusting a model for optical proximity correction with reference to measured data with at least one of focus and exposure dose deviating, generating a second corrected pattern by correcting the pattern to be processed based on the model for optical proximity correction adjusted with reference to the measured data with at least one of focus and exposure dose deviating, generating a composed pattern by combining the first corrected pattern and the second corrected pattern, and correcting the border of the composed pattern on a rule basis.

Thereby, it becomes possible to carry out optical proximity correction of the mask pattern considering the photo margin, and even in the case where the exposure dose or the focus deviates in the exposure step, it is possible to effectively correct the optical proximity effect.

An optical proximity correction method according to another aspect of the present invention includes:

inputting data of a pattern to be processed;

adjusting a model for optical proximity correction with reference to measured data with proper focus and exposure dose;

generating a first corrected pattern by adding a hammerhead, a serif and a bias to each line-end region, corner region, and line-and-space region of the pattern to be processed, based on the model for optical proximity correction adjusted with reference to the measured data with proper focus and exposure dose;

adjusting a model for optical proximity correction with reference to measured data with at least one of focus and exposure dose deviating;

generating a second corrected pattern by adding a hammerhead, a serif and a bias to each line-end region, corner region, and line-and-space region of the pattern to be processed, based on the model for optical proximity correction adjusted with reference to the measured data with at least one of focus and exposure dose deviating;

generating a composed pattern by combining the first corrected pattern and the second corrected pattern; and correcting the border of the composed pattern on a rule basis.

Thereby, it becomes possible to add a hammerhead, a serif and a bias to each line-end region, corner region, and line-and-space region of the pattern to be processed with consideration to the photo margin, and thus, the optical proximity effect can be effectively corrected even in the case where the exposure dose or the focus deviates in the exposure step.

A manufacturing method for a semiconductor device according to another aspect of the present invention includes:

applying photoresist onto a semiconductor wafer;

exposing the photoresist through an exposure mask that is corrected by simulation-based correction based on both measured data with proper focus and exposure dose and measured data with at least one of focus and exposure dose deviating;

developing the exposed photoresist; and providing the semiconductor wafer with ion implantation or etching using the developed photoresist as a mask.

Thereby, it becomes possible to use the exposure mask wherein the optical proximity effect has been corrected with consideration to the photo margin for carrying out photolithography, and even in the case where the exposure dose or the focus deviates in the exposure step, fine patterns can be formed with good precision.

An optical proximity correction program according to another aspect of the present invention includes:

receiving data of a pattern to be processed, adjusting a model for optical proximity correction with reference to measured data with proper focus and exposure dose, generating a first corrected pattern by correcting the pattern to be processed based on the model for optical proximity correction adjusted with reference to the measured data with proper focus and exposure dose, adjusting a model for optical proximity correction with reference to measured data with at least one of focus and exposure dose deviating, generating a second corrected pattern by correcting the pattern to be processed based on the model for optical proximity correction adjusted with reference to the measured data with at least one of focus and exposure dose deviating, generating a composed pattern by combining the first corrected pattern and the second corrected pattern, and correcting the border of the composed pattern on a rule basis, and all of the above is processed by a computer.

Thereby, by processing the optical proximity correction program with a computer, it becomes possible to carry out optical proximity correction with consideration to the photo margin, and even in the case where the exposure dose or the focus deviates in the exposure step, it becomes possible to efficiently generate a mask pattern that enables the optical proximity effect to be effectively corrected.

An optical proximity correction program according to another aspect of the present invention includes:

receiving data of a pattern to be processed;

adjusting a model for optical proximity correction with reference to measured data with proper focus and exposure dose;

generating a first corrected pattern by adding a hammerhead, a serif and a bias to each line-end region, corner region, and line-and-space region of the pattern to be processed, based on the model for optical proximity correction adjusted with reference to the measured data with proper focus and exposure dose;

adjusting a model for optical proximity correction with reference to measured data with at least one of focus and exposure dose deviating;

generating a second corrected pattern by adding a hammerhead, a serif and a bias to each line-end region, corner region, and line-and-space region of the pattern to be processed, based on the model for optical proximity correction adjusted with reference to the measured data with at least one of focus and exposure dose deviating;

generating a composed pattern by combining the first corrected pattern and the second corrected pattern; and correcting the border of the composed pattern on a rule basis, and all of the above is processed by a computer.

Thereby, by processing the optical proximity correction program with a computer, it becomes possible to add a hammerhead, a serif and a bias with consideration to the photo margin to each line-end region, corner region, and line-and-space region of the pattern to be processed, and it becomes possible to efficiently generate a mask pattern that enables the optical proximity effect to be effectively corrected even in the case where the exposure dose or the focus deviates in the exposure step.

DETAILED DESCRIPTION

Following is an explanation of an optical proximity correction method according to an embodiment of the present invention with reference to the drawings.

Figure 1:
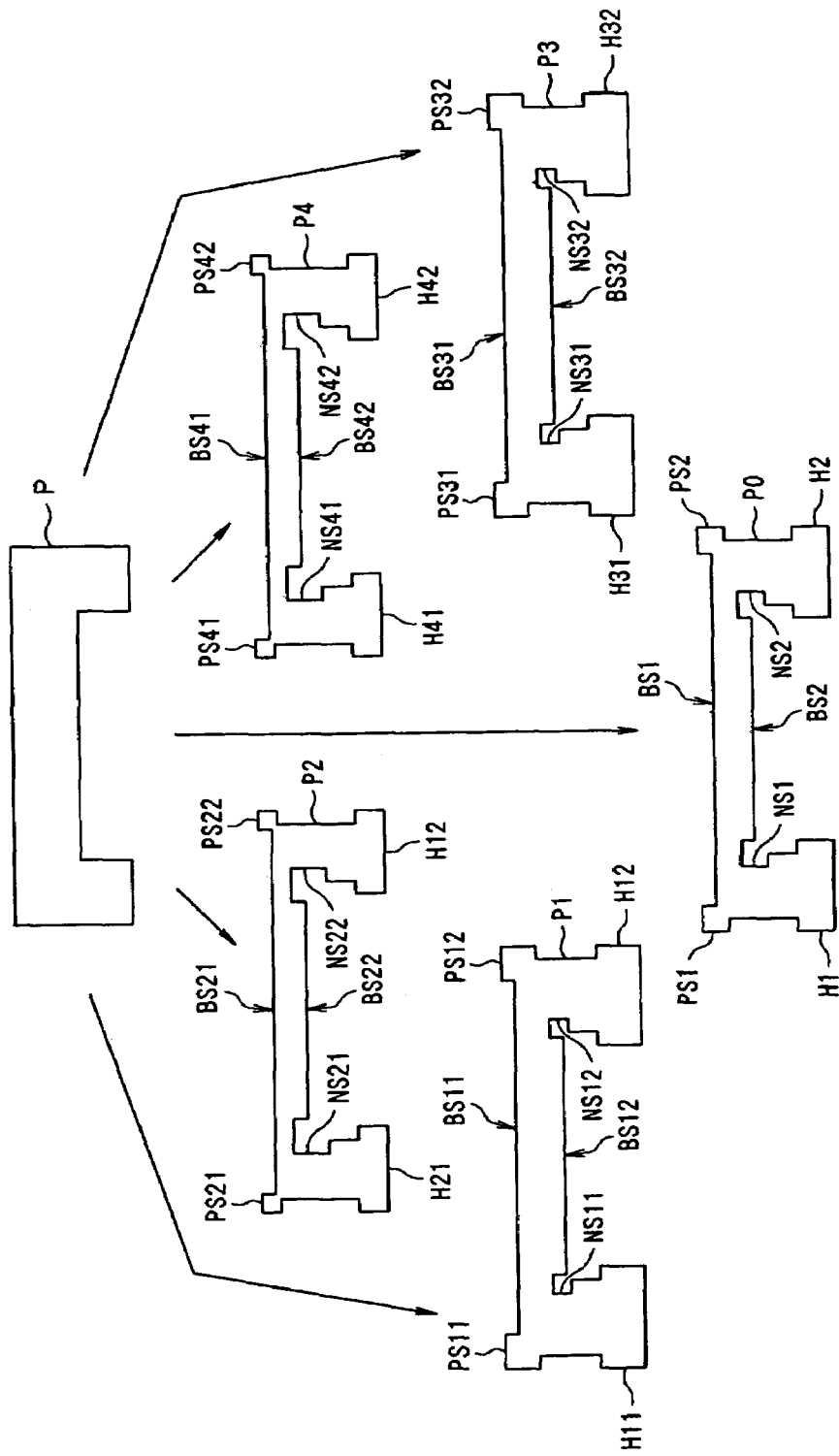
FIG. 1 is a view showing an optical proximity correction method according to an embodiment.
Figure 2:
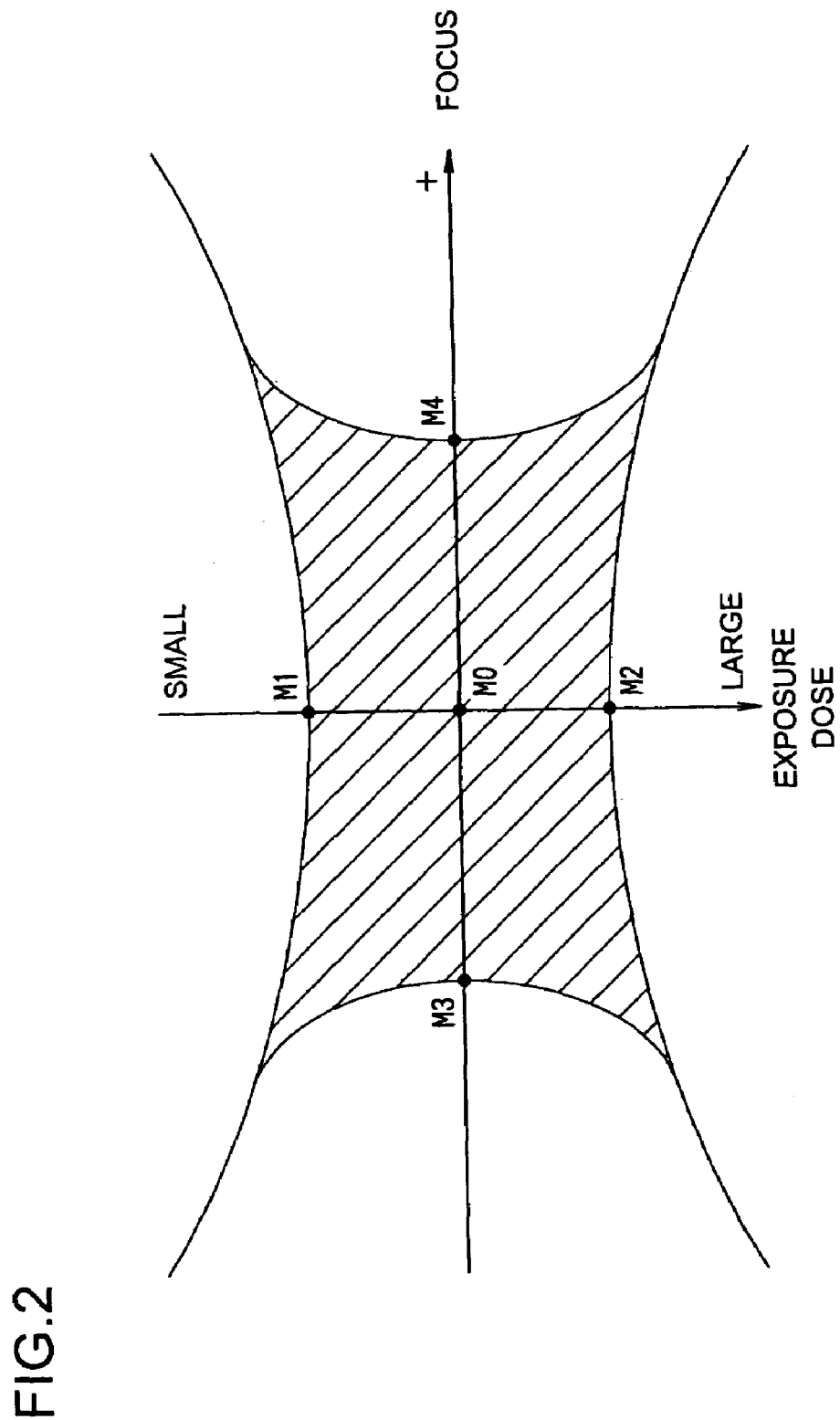
FIG. 2 is a view showing a photo margin according to an embodiment.
Figure 3:
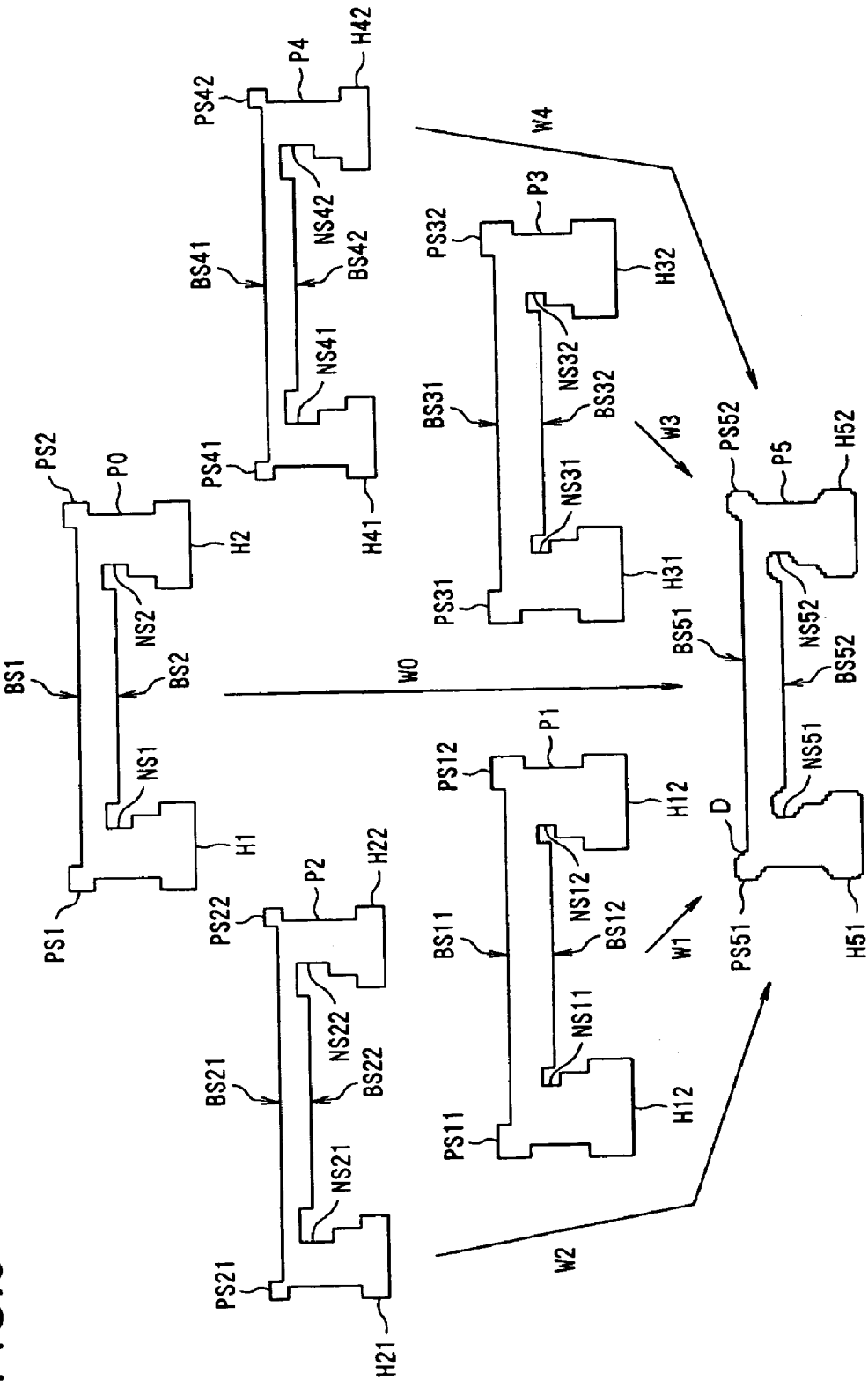
FIG. 3 is a view showing an optical proximity correction method according to an embodiment.
Figure 4A:
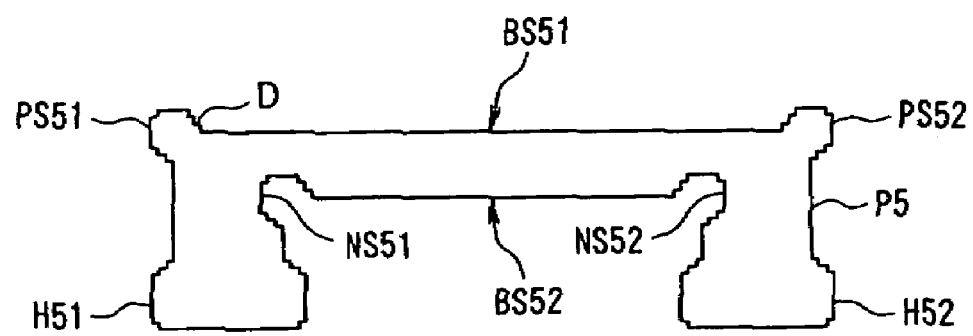
FIGS. 4A and B are views showing an optical proximity correction method according to an embodiment.
Figure 4B:
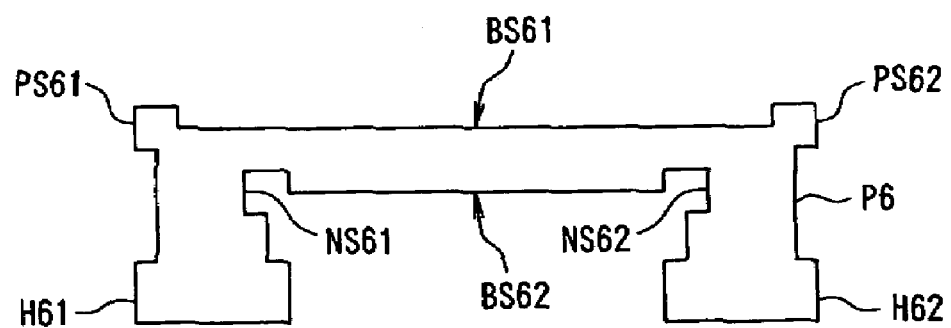

FIG. 1, FIG. 3 and FIG. 4 are plan views showing an optical proximity correction method according to an embodiment of the present invention, FIG. 2 is a view showing a photo margin in the photolithography according to an embodiment of the present invention.

In FIG. 1, for example, a U-shaped pattern is given as a pattern P to be processed. Here, the pattern P to be processed can be made up of parts to be processed, and as the parts to be processed, for example, line-end regions, corner regions and line-and-space regions can be given. The line-end regions correspond to ends of the pattern P to be processed, the corner regions correspond to the corner parts (including the inner and outer corners) of the pattern P to be processed, and the line-and-space regions correspond to the remaining regions with the exemption of the line-end regions and the corner regions. Further, isolated lines (patterns in the shape of a single line) can be included in the line-and-space regions.

When the pattern P to be processed is given, through an exposure mask onto which the pattern P to be processed is formed, the photoresist is exposed with proper focus and exposure dose. The exposed photoresist is developed, and a resist pattern is formed with proper focus and exposure dose. The resist pattern with proper focus and exposure dose is then checked using an SEM (scanning electron microscope) or the like, and thereby measured data of the resist pattern with proper focus and exposure dose is obtained. After obtaining the measured data of the resist pattern with proper focus and exposure dose, a model for optical proximity correction is adjusted based on the measured data of the resist pattern with proper focus and exposure dose. Based on the model for optical proximity correction adjusted with reference to the measured data with proper focus and exposure dose, a corrected pattern is generated with the pattern P to be processed corrected on a simulation basis.

Further, when the pattern P to be processed is given, through an exposure mask onto which the pattern P to be processed is formed, the photoresist is exposed under a condition with at least one of focus and exposure dose deviating. The exposed photoresist is developed, and a resist pattern is formed with at least one of focus and exposure dose deviating. The resist pattern with at least one of focus and exposure dose deviating is then checked using an SEM (scanning electron microscope) or the like, and thereby measured data of the resist pattern with at least one of focus and exposure dose deviating is obtained. After obtaining the measured data of the resist pattern with at least one of focus and exposure dose deviating, a model for optical proximity correction is adjusted based on the measured data of the resist pattern with at least one of focus and exposure dose deviating. Based on the model for optical proximity correction adjusted with reference to the measured data with at least one of focus and exposure dose deviating, a corrected pattern is generated with the pattern P to be processed corrected on a simulation basis.

Here, the measured data on the borderline of the photo margin can be used as the measured data with at least one of focus and exposure dose deviating. That is to say, as shown in FIG. 2, the photo margin is set to show the tolerances of the scattering of the exposure dose and the deviation of the focus in the photo process. As measured data on a borderline K of the photo margin the following conditions (further referred to as states) can be used for example:

an M1 state where the focus is in focus and the exposure dose is at the lower limit, an M2 state where the focus is in focus and the exposure dose is at the upper limit, an M3 state where the focus deviates to the lower side and the exposure dose is optimal, and an M4 state where the focus deviates to the upper side and the exposure dose is optimal.

Further, as measured data with proper focus and exposure dose, an M0 state where focus is in focus and the exposure dose is optimal can be used.

Based on the optical proximity correction model corresponding to the M0 state where the focus is in focus and the exposure dose is optimal, a corrected pattern P0 corrected on a simulation basis can be generated by adding hammerheads H1 and H2, negative serifs NS1 and NS2, positive serifs PS1 and PS2, and biases BS1 and BS2 to each line-end region, inner corner region, outer corner region, and line-and-space region of the pattern P to be processed, as shown in FIG. 1.

Further, based on the optical proximity correction model corresponding to the M1 state where the focus is in focus and the exposure dose is at the lower limit, a corrected pattern P1 corrected on a simulation basis can be generated by adding hammerheads H11 and H12, negative serifs NS11 and NS12, positive serifs PS11 and PS12, and biases BS11 and BS12 to each line-end region, inner corner region, outer corner region, and line-and-space region of the pattern P to be processed, as shown in FIG. 1.

Further, based on the optical proximity correction model corresponding to the M2 state where the focus is in focus and the exposure dose is at the upper limit, a corrected pattern P2 corrected on a simulation basis can be generated by adding hammerheads H21 and H22, negative serifs NS21 and NS22, positive serifs PS21 and PS22, and biases BS21 and BS22 to each line-end region, inner corner region, outer corner region, and line-and-space region of the pattern P to be processed, as shown in FIG. 1.

Further, based on the optical proximity correction model corresponding to the M3 state where the focus deviates to the lower side and the exposure dose is optimal, a corrected pattern P3 corrected on a simulation basis can be generated by adding hammerheads H31 and H32, negative serifs NS31 and NS32, positive serifs PS31 and PS32, and biases BS31 and BS32 to each line-end region, inner corner region, outer corner region, and line-and-space region of the pattern P to be processed, as shown in FIG. 1.

Further, based on the optical proximity correction model corresponding to the M4 state where the focus deviates to the upper side and the exposure dose is optimal, a corrected pattern P4 corrected on a simulation basis can be generated by adding hammerheads H41 and H42, negative serifs NS41 and NS42, positive serifs PS41 and PS42, and biases BS41 and BS42 to each line-end region, inner corner region, outer corner region, and line-and-space region of the pattern P to be processed, as shown in FIG. 1.

Accordingly, the pattern P0 corresponding to the M0 state where the focus is in focus and the exposure dose is optimal, the pattern P1 corresponding to the M1 state where the focus is in focus and the exposure dose is at the lower limit, the pattern P2 corresponding to the M2 state where the focus is in focus and the exposure dose is at the upper limit, the pattern P3 corresponding to the M3 state where the focus deviates to the lower side and the exposure dose is optimal, and the pattern P4 corresponding to the M4 state where the focus deviates to the upper side and the exposure dose is optimal are generated. Subsequently, a composed pattern P5 is generated by combining these corrected patterns P0 through P4. More specifically, hammerheads H51 and H52, negative serifs NS51 and NS52, positive serifs PS51 and PS52 and biases BS51 and BS52 are added to each line-end region, inner corner region, outer corner region, and line-and-space region of the pattern P to be processed, as shown in FIG. 3.

Thereby, it becomes possible to add the hammerheads H51 and H52, the negative serifs NS51 and NS52, the positive serifs PS51 and PS52, and the biases BS51 and BS52 to each line-end region, corner region, and line-and-space region of the pattern P to be processed, while reflecting the scattering of the exposure dose or the deviation of the focus, and the optical proximity effect can be effectively corrected even in the case where the exposure dose or the focus deviates in an exposure step.

When generating the composed pattern P5 from the corrected patterns P0 through P4, the dimensional deviations between the pattern P to be processed and each corrected pattern P0 to P4 are calculated as for at least part of edges. The composed pattern P5 can also be generated by multiplying the dimensional deviations between the pattern P to be processed and each corrected pattern P0 to P4 by weights W0 to W4, and calculating the weighted average of each edge of the patterns P0 to P4.

Thereby, while enabling the adjustment of the degree to which the scattering of the exposure dose and the deviation of the focus are reflected, it becomes possible to easily combine the corrected patterns P0 to P4 reflecting the scattering of the exposure dose and the deviation of the focus, and to efficiently generate the composed pattern P5 reflecting the scattering of the exposure dose and the deviation of the focus.

Here, when generating the composed pattern P5 from the corrected patterns P0 through P4, as shown in FIG. 4 (*a*), in the vicinity of the border of the composed pattern P5 steps D are created., As shown in FIG. 4 (*b*), by providing rule-based correcting for the vicinity of the border of the composed pattern P5 on a rule basis, the steps D created in the vicinity of the border of the composed pattern P5 can be easily removed.

Thereby, by combining of the corrected patterns P0 through P4 reflecting the scattering of the exposure dose and the deviation of the focus, even in the case where the steps D have been created in the vicinity of the border of the composed pattern P5, it becomes possible to easily remove these steps D, and to pass through a design rule check or an optical rule check.

Here, simulation-based correction uses a simulator wherein the phenomena that accompany the exposure process are modeled. Simulation-based correction is disclosed, for example, in a paper by Satomi Shioiri et al, titled: Fast optical proximity correction: analytical method, in: Optical/Laser Microlithography VIII, Vol. 2440, SPIE Symposium on Microlithography 1995, p. 261-269.

Here, rule-based correction is a method to carry out optical proximity correction based on previously determined correction rules. Rule-based correction is disclosed, for example, in a paper by Oberdan W. Otto et al, titled: Automated optical proximity correction—a rule-based approach, in: Optical/Laser Microlithography VII, Vol. 2197, SPIE Symposium on Microlithography 1994, p. 278-293, and in a paper by Richard C. Henderson et al, titled: correcting for proximity effect widens process latitude, p. 361-370.

Further, in the above-mentioned embodiment, a method is explained, that uses, as the measured data on the borderline K of the photo margin, the M1 state where the focus is in focus and the exposure dose is at the lower limit, the M2 state where the focus is in focus and the exposure dose is at the upper limit, the M3 state where the focus deviates to the lower side and the exposure dose is optimal, and the M4 state where the focus deviates to the upper side and the exposure dose is optimal. However, it is not limited to the above, that is, it is not necessary to include all of these states M1 to M4, and alternatively, states M1 to M4 different from these can be used to generate the composed pattern.

Figure 5:
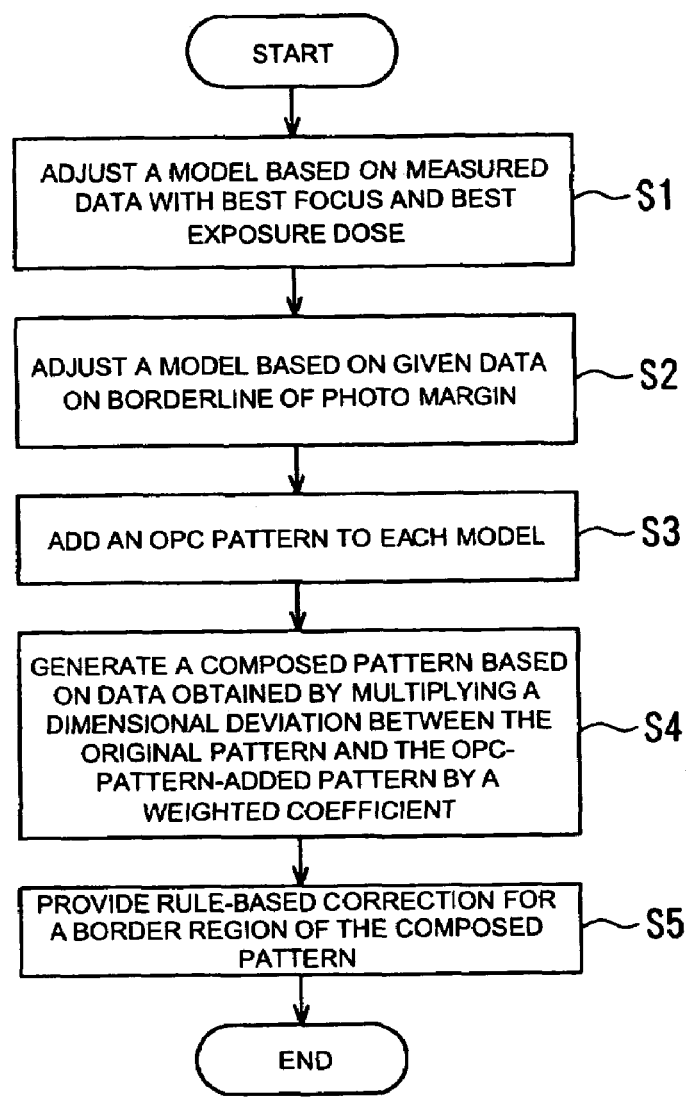
FIG. 5 is a flowchart showing an optical proximity correction method according to an embodiment.

FIG. 5 is a flowchart showing an optical proximity correction method according to an embodiment of the present invention.

In FIG. 5, when a pattern to be processed for optical proximity correction is inputted, a resist pattern can be obtained with proper focus and exposure dose, by exposing a photoresist under a condition with proper focus and exposure dose through an exposure mask, onto which the pattern to be processed is formed. And, based on the measured data of the resist pattern with proper focus and exposure dose a model for optical proximity correction is adjusted (Step 1).

Further, when the pattern to, be processed for optical proximity correction is inputted, a resist pattern with at least one of focus and exposure dose deviating is obtained by exposing the photoresist under a condition where focus and exposure dose are set on the borderline K of the photo margin of FIG. 2, through an exposure mask, onto which the pattern to be processed is formed. And, based on the measured data of the resist pattern with at least one of focus and exposure dose deviating a model for optical proximity correction is adjusted (Step 2).

Further, when the model for optical proximity correction that was adjusted under the condition with proper focus and exposure dose, and the model for optical proximity correction that was composed under the condition with at least one of focus and exposure dose deviating are obtained, an OPC pattern is added to the pattern to be processed according to each optical proximity correction model (Step 3).

Next, when the corrected pattern is generated to which each OPC pattern has been added, the dimensional deviation between the pattern to be processed and the corrected pattern is calculated as for at least part of edges. The dimensional deviation between the pattern to be processed and the corrected pattern is then multiplied by a weight, and a composed pattern is generated by calculating the weighted average of the edges of the patterns (Step 4).

After the composed pattern is generated, by providing rule-based correction for the vicinity of the border of the composed pattern, steps that have been created in the vicinity of the border of the composed pattern are removed (Step 5).

What is claimed is:

1. An optical proximity correction device, comprising:
   a data input means for inputting data of a pattern to be processed;
   a first corrected pattern generating means for generating a first corrected pattern by correcting the pattern to be processed based on a model adjusted with reference to measured data with proper focus and exposure dose;
   a second corrected pattern generating means for generating a second corrected pattern by correcting the pattern to be processed based on a model adjusted with reference to measured data with at least one of focus and exposure dose deviating; and
   a composed pattern generating means for generating a composed pattern by combining the first corrected pattern and the second corrected pattern, the composed pattern generating means including:
      a first dimensional deviation calculating means for calculating a dimensional deviation between the pattern to be processed and the first corrected pattern as for at least part of edges;
      a second dimensional deviation calculating means for calculating a dimensional deviation between the pattern to be processed and the second corrected pattern as for at least part of edges; and
      a weighted average calculating means for calculating a weighted average of the dimensional deviations each calculated by the first dimensional deviation calculating means and the second dimensional deviation calculating means.

2. The optical proximity correction device according to claim 1, wherein the measured data with at least one of focus and exposure dose deviating is data on a photo margin borderline.

3. The optical proximity correction device according to claim 1, further comprising:
   a rule-based correcting means for rule-based correcting of a border of a composed pattern generated by the composed pattern generating means.

4. An optical proximity correction device, comprising:
   a data input means for inputting data of a pattern to be processed;
   a first corrected pattern generating means for generating a first corrected pattern by adding a hammerhead, a serif and a bias to each line-end region, corner region, and line-and-space region of the pattern to be processed, based on a model adjusted with reference to measured data with proper focus and exposure dose;
   a second corrected pattern generating means for generating a second corrected pattern by adding a hammerhead, a serif and a bias to each line-end region, corner region, and line-and-space region of the pattern to be processed, based on a model adjusted with reference to measured data with at least one of focus and exposure dose deviating; and
   a composed pattern generating means for generating a composed pattern by combining the first corrected pattern and the second corrected pattern, the composed pattern generating means including:
      a first dimensional deviation calculating means for calculating a dimensional deviation between the pattern to be processed and the first corrected pattern as for at least part of edges;
      a second dimensional deviation calculating means for calculating a dimensional deviation between the pattern to be processed and the second corrected pattern as for at least part of edges; and
      a weighted average calculating means for calculating a weighted average of the dimensional deviations each calculated by the first dimensional deviation calculating means and the second dimensional deviation calculating means.

5. The optical proximity correction device according to claim 4, wherein the measured data with at least one of focus and exposure dose deviating is data on a photo margin borderline.

6. The optical proximity correction device according to claim 4, further comprising:
   a rule-based correcting means for rule-based correcting of a border of a composed pattern generated by the composed pattern generating means.

7. An optical proximity correction method, comprising:
   inputting data of a pattern to be processed;
   adjusting a model for optical proximity correction with reference to measured data with proper focus and exposure dose;
   generating a first corrected pattern by correcting the pattern to be processed based on the model for optical proximity correction adjusted with reference to the measured data with proper focus and exposure dose;
   adjusting a model for optical proximity correction with reference to measured data with at least one of focus and exposure dose deviating;
   generating a second corrected pattern by correcting the pattern to be processed based on the model for optical proximity correction adjusted with reference to the measured data with at least one of focus and exposure dose deviating;
   generating a composed pattern by combining the first corrected pattern and the second corrected pattern; and
   correcting a border of the composed pattern on a rule basis;
   wherein the generating the composed pattern includes:
      calculating a dimensional deviation between the pattern to be processed and the first corrected pattern as for at least part of edges;
      calculating a dimensional deviation between the pattern to be processed and the second corrected pattern as for at least part of edges; and
      calculating a weighted average of the dimensional deviations.

8. An optical proximity correction method, comprising:
inputting data of a pattern to be processed;
adjusting a model for optical proximity correction with reference to measured data with proper focus and exposure dose;
generating a first corrected pattern by adding a hammerhead, a serif and a bias to each line-end region, corner region, and line-and-space region of the pattern to be processed, based on the model for optical proximity correction adjusted with reference to the measured data with proper focus and exposure dose;
adjusting a model for optical proximity correction with reference to measured data with at least one of focus and exposure dose deviating;
generating a second corrected pattern by adding a hammerhead, a serif and a bias to each line-end region, corner region, and line-and-space region of the pattern to be processed, based on the model for optical proximity correction adjusted with reference to the measured data with at least one of focus and exposure dose deviating;
generating a composed pattern by combining the first corrected pattern and the second corrected pattern; and
correcting a border of the composed pattern on a rule basis;
wherein the generating the composed pattern includes:
calculating a dimensional deviation between the pattern to be processed and the first corrected pattern as for at least part of edges;
calculating a dimensional deviation between the pattern to be processed and the second corrected pattern as for at least part of edges; and
calculating a weighted average of the dimensional deviations.

9. An optical proximity correction program, comprising:
receiving data of a pattern to be processed;
adjusting a model for optical proximity correction with reference to measured data with proper focus and exposure dose;
generating a first corrected pattern by correcting the pattern to be processed based on the model for optical proximity correction adjusted with reference to the measured data with proper focus and exposure dose;
adjusting a model for optical proximity correction with reference to measured data with at least one of focus and exposure dose deviating;
generating a second corrected pattern by correcting the pattern to be processed based on the model for optical proximity correction adjusted with reference to the measured data with at least one of focus and exposure dose deviating;
generating a composed pattern by combining the first corrected pattern and the second corrected pattern; and
correcting a border of the composed pattern on a rule basis,
wherein the generating the composed pattern includes:
calculating a dimensional deviation between the pattern to be processed and the first corrected pattern as for at least part of edges;
calculating a dimensional deviation between the pattern to be processed and the second corrected pattern as for at least part of edges; and
calculating a weighted average of the dimensional deviations;
and wherein all of the above steps are processed by a computer.

10. An optical proximity correction program, comprising:
receiving data of a pattern to be processed;
adjusting a model for optical proximity correction with reference to measured data with proper focus and exposure dose;
generating a first corrected pattern by adding a hammerhead, a serif and a bias to each line-end region, corner region, and line-and-space region of the pattern to be processed, based on the model for optical proximity correction adjusted with reference to the measured data with proper focus and exposure dose;
adjusting a model for optical proximity correction with reference to measured data with at least one of focus and exposure dose deviating;
generating a second corrected pattern by adding a hammerhead, a serif and a bias to each line-end region, corner region, and line-and-space region of the pattern to be processed, based on the model for optical proximity correction adjusted with reference to the measured data with at least one of focus and exposure dose deviating;
generating a composed pattern by combining the first corrected pattern and the second corrected pattern; and
correcting a border of the composed pattern on a rule basis,
wherein the generating the composed pattern includes:
calculating a dimensional deviation between the pattern to be processed and the first corrected pattern as for at least part of edges;
calculating a dimensional deviation between the pattern to be processed and the second corrected pattern as for at least part of edges; and
calculating a weighted average of the dimensional deviations;
and wherein all of the above steps are processed by a computer.

* * * * *